United States Patent [19]

Peterson

[11] 4,393,267

[45] Jul. 12, 1983

[54] METHOD FOR IMPROVING THE EFFICIENCY OF A SOLAR CELL AND AN IMPROVED CADMIUM SULFIDE/COPPER SULFIDE PHOTOVOLTAIC CELL

[75] Inventor: Terry M. Peterson, El Cerrito, Calif.

[73] Assignee: Chevron Research Company, San Francisco, Calif.

[21] Appl. No.: 278,799

[22] Filed: Jun. 29, 1981

Related U.S. Application Data

[63] Continuation-in-part of Ser. No. 267,324, May 26, 1981, abandoned.

[51] Int. Cl.³ .................... H01L 31/06; H01L 31/18
[52] U.S. Cl. .................................... 136/260; 29/572; 427/74; 357/30
[58] Field of Search ................. 427/74; 29/572; 136/258 PC, 260, 265; 357/30

[56] References Cited

U.S. PATENT DOCUMENTS 4,167,805  9/1979  Castel ............................. 29/572
4,318,938  3/1982  Barnett et al. ................... 427/75
4,362,896  12/1982  Singh ............................ 136/258

OTHER PUBLICATIONS

J. V. Florio et al., "Atomic Absorption Analysis & Auger Depth Profiles of Heat-Treated Polycrystalline $Cu_x$/CdS Solar Cells", *Conf. Record, 15th IEEE Photovoltaic Specialists Conf.* (1981), pp. 793-799.

*Primary Examiner*—Aaron Weisstuch
*Attorney, Agent, or Firm*—D. A. Newell; E. J. Keeling; A. Stephen Zavell

[57] ABSTRACT

A CdS/$Cu_x$S solar cell and method of fabricating the solar cell. The CdS layer of the solar cell is fabricated on a conductive substrate and forms an ohmic contact thereto. Thereafter, a layer of $Cu_x$S is fabricated on the CdS layer and the combined structure is rinsed in an aqueous acidic rinse having a pH less than about pH3 prior to curing the device in hydrogen at an elevated temperature and fabricating a copper containing electrical contact to the $Cu_x$S layer. The rinsing of the device prior to curing improves the performance of the finished solar cell.

8 Claims, 2 Drawing Figures

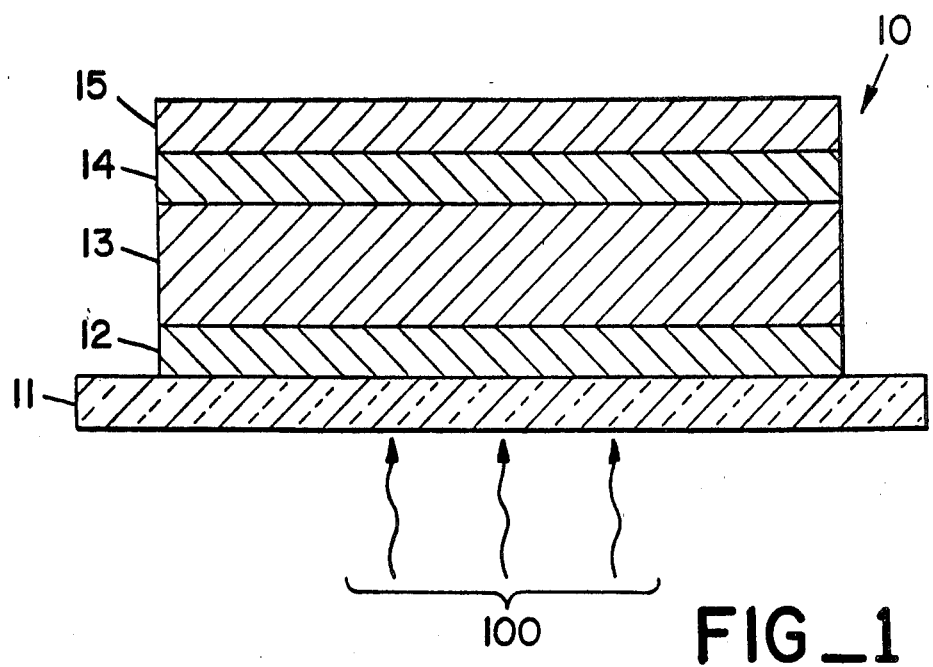
FIG_1
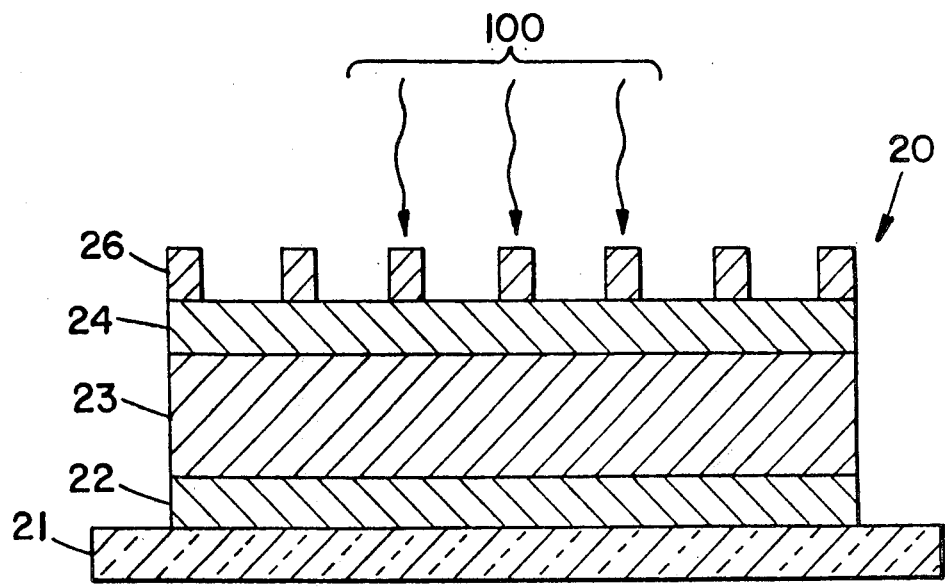
FIG_2

METHOD FOR IMPROVING THE EFFICIENCY OF A SOLAR CELL AND AN IMPROVED CADMIUM SULFIDE/COPPER SULFIDE PHOTOVOLTAIC CELL

CROSS-REFERENCES TO RELATED APPLICATIONS

This is a continuation-in-part application of my U.S. application Ser. No. 267,324, filed May 26, 1981, now abandoned, and titled: "A METHOD FOR IMPROVING THE EFFICIENCY OF A SOLAR CELL AND AN IMPROVED CADMIUM SULFIDE/COPPER SULFIDE PHOTOVOLTAIC CELL".

This invention relates to photovoltaic cells. More specifically, this invention relates to a method of improving the efficiency of photovoltaic cells.

BACKGROUND OF THE INVENTION

Photovoltaic cells such as $CdS/Cu_xS$ solar cells are capable of converting solar radiation into usable electrical energy. The energy conversion occurs as a result of what is well known in the solar field as the photovoltaic effect. Solar radiation impinging on a solar cell is absorbed by a semiconductor layer which generates electrons and holes. The electrons and holes are separated by a built-in electric field, for example, a rectifying junction such as a PN junction in the solar cell. The electrons flow towards the N-type material and the holes flow towards the P-type semiconductor material. The separation of the electrons and holes across the rectifying junction results in the generation of an electric current known as the photocurrent and a voltage known as the photovoltage. The performance of $CdS/Cu_xS$ solar cells is in part dependent on the sharpness of transition from the layer of CdS to the layer of $Cu_xS$. The optimum composition of the $Cu_xS$ layer is in the range where x varies from 1.95 to 2.0, preferably higher than 1.995. Many heat treatments in $H_2$ are needed to achieve optimum device efficiencies. Thus, it would be highly desirable to find a method of insuring increasing x to improve the efficiency of the solar cell and shorten the processing time and steps.

SUMMARY OF THE INVENTION

The invention provides a method of increasing the performance of a $CdS/Cu_xS$ solar cell and shortening the processing time and steps. After the fabrication of the cadmium sulfide/copper sulfide layers and prior to the formation of the contacting grid to the copper sulfide layer, the solar cell is subjected to an acidic rinse for a sufficient time to remove performance degrading impurities. Solar cells fabricated with an acidic rinse after the formation of the copper sulfide layer and prior to the formation of the electrode layer contacting the copper sulfide layer exhibit initially increased efficiencies over solar cells fabricated in an otherwise similar fashion, but without the acid rinse, and require fewer heat treatments to achieve optimum device efficiencies.

BRIEF DESCRIPTION OF THE DRAWINGS

FIG. 1 illustrates a cross-sectional view of a backwall-type photovoltaic cell. A backwall cell is defined as a solar cell wherein the light passes through a conducting electrode and a lesser absorbing semiconductor layer before reaching the principal absorbing layer.

FIG. 2 illustrates a cross-sectional view of a frontwall-type photovoltaic cell in which the light enters through a metal grid electrode and passes through the absorber layer and the collector layer.

DETAILED DESCRIPTION OF THE INVENTION

The invention will be more clearly illustrated by referring to the figures. FIG. 1 illustrates a backwall-type solar cell 10. Solar radiation 100 serves as a reference point for indicating the incident surface of each layer. Solar cell 10 has a transparent substrate 11 of glass, sapphire, or other suitable materials. Deposited on substrate 10 is an electrode 12 of a transparent conductive oxide, TCO, such as stannic oxide, indium tin oxide, cadmium stannate, stannic oxide containing antimony, or a thin light-transparent conductive metal such as platinum, gold or aluminum, and the like. The transparent metal layer is usually about 5 to 10 nanometers in thickness while a TCO layer is about 100 to 500 nanometers thick. Preferably, the transparent conductive oxide or metal should have a resistance of about 10 ohms/square or lower and form an ohmic contact to the subsequently deposited semiconductor layer 13. Optionally, the transparent conductive oxide can be a conducting cermet layer as taught in U.S. Pat. No. 4,162,505, and incorporated herein by reference.

A conductive glass, suitable to function as the transparent substrate 11 with TCO layer 12, having stannic oxide fused to its surface, is commercially available under trade names such as "EC" and "NESA". The stannic oxide lamination and like materials are deposited by spraying a solution of stannic chloride pentahydrate and formaldehyde solution onto a glass substrate heated to about 500° C. By selecting the thickness of the TCO layer 12, the transparent electrode can also function as an integral antireflection coating.

A semiconductor layer 13 is deposited on the transparent conductive oxide 12 and forms an ohmic contact thereto. The semiconductor layer 13 is cadmium sulfide. Optionally, layer 13 can be selected from semiconductor materials such as $Zn_xCd_{1-x}S$, and like materials. The semiconductor layer 13 is from about 0.2 to 40 micrometers (μm) in thickness. The cadmium sulfide and like semiconductor materials are N-type. Layers 12 and 13 are deposited by methods known in the art such as solution coating or cosputtering as taught in U.S. Pat. No. 4,143,235, incorporated herein by reference, or U.S. application Ser. No. 197,414, filed Oct. 16, 1980, and incorporated herein by reference.

The absorber layer 14 is $Cu_xS$ wherein x can vary from 1.8 to 2, although it is preferable that x is very near to 2, and preferably about 1.995, as taught in the previously referred to application. Layer 14 is usually from about 0.05 to 1 micrometer thick. The absorber layer is of opposite conductivity type to the semiconductor layer 13. With $Cu_xS$ as the absorber layer 14, the layer is so highly P-type doped that it approaches a degenerate state. Layer 14 is usually fabricated by topochemical formation, as taught in U.S. Pat. No. 4,143,235, or by methods recited in U.S. application Ser. No. 197,414.

Finally, a back electrode layer 15 is deposited on the absorber layer 14 by methods known in the art to from an ohmic, non-rectifying contact with the absorber layer. Suitable electrodes are materials such as gold, platinum, carbon and other high-work function metals such as chromium.

FIG. 2 refers to a frontwall solar cell 20. Solar radiation 100 serves as a reference point for indicating the incident surface of each layer. Solar cell 20 incorporates similar layers to solar cell 10, described previously. The substrate 21 corresponds to substrate 11, layer 22 corresponds to layer 12, layer 23 corresponds to layer 13, and layer 24 corresponds to layer 14. In frontwall solar cell 20, the electrode contacting layer 15 of solar cell 10 is replaced by a grid electrode 26 to permit solar radiation 100 to pass therethrough. The grid electrode 26 can be from the same materials as electrode layer 15. The grid electrode 26 occupies only a small area of the surface of the solar cell, i.e., about 5% to 10%. The grid electrode provides for the uniform collection of current generated during illumination of solar cell 20. The grid electrode can be any configuration known in the art and fabricated by methods known in the art such as sputtering a metal through a mask or fabrication by standard photoresist and etching techniques.

The method of the present invention comprises the rinsing of the solar cell in an acid solution having a pH of less than pH 3, and preferably less than pH 2, prior to formation of electrodes 15 or 26. Any suitable acid capable of reducing the pH of the standard aqueous rinse to below pH 3 is suitable, such as sulfuric acid, hydrochloric acid, hydrofloric acid, and hydrobromic acid. Reducing acids with respect to the $Cu^{++}$ ion are preferred. The acid rinse should be for a sufficient time to remove materials such as cuprous chloride, cadmium, $Cu^{++}$ ions and oxides such as CuO which increase electrical resistance between electrodes 15 and 26 and layers 14 and 24, respectively. A rinse of from 10 to 50 seconds is usually sufficient. Preferably, the acid rinse solution is at a temperature of about 25° C.

The invention will be more clearly illustrated by referring to the following examples. However, the examples are not intended to limit the invention. Modifications which would be obvious to the skilled artisan are considered within the scope of the invention.

EXAMPLE I

A $CdS/Cu_xS$ solar cell was prepared as follows: A Corning 7059 glass substrate was cleaned and etched for 10 seconds in 48% HF, washed in Liquinox (20%) for 10 minutes, and rinsed with deionized water. Thereafter, a 1.5 $\mu m$ layer of copper was sputtered onto the glass. A layer of zinc about 100 nanometers thick was evaporated onto the copper. A 40 $\mu m$ layer of CdS with a resistivity of about 0.5 to 0.6 ohm-cm was vacuum evaporated onto the Cu/Zn heated to about 220° C. Thereafter, a $Cu_xS$ film having a thickness of about 0.2 $\mu m$ was formed by dipping the substrate in a solution comprising 4 liters of deionized $H_2O$, 24 grams copper chloride, 8 grams of NaCl, and 80 cc of 0.5 M HCl for about 10 seconds. Finally, the cell was rinsed in a pH 2 rinse prior to a 16 hour heat treatment in pure $H_2$ at 150° C. and vacuum evaporation of about 2.5 microns of Au through a mask onto the $Cu_xS$ layer to form a contact grid.

COMPARATIVE EXAMPLE A

A solar cell was prepared in accordance with the procedures in Example I. However, after the formation of the $Cu_xS$ layer, the solar cell was rinsed in deionized water for about 10 seconds. Table 1 below illustrates a comparison of the open circuit voltage, $V_{oc}$; the short circuit current, $J_{sc}$; the fill factor, FF; the efficiency, %; and the estimated sunlight efficiency, S%. The efficiency was converted to an estimated sunlight efficiency by multiplying by the conversion factor 1.35.

The conversion factor was determined from a simulator-sunlight comparison on similar cells.

TABLE 1

| Examples | $V_{oc}$ | $J_{sc}$ | F.F. | % | S % |
|---|---|---|---|---|---|
| I | .458 | 3.58 | .689 | 1.40 | 1.89 |
| A | .436 | 2.38 | .697 | 1.07 | 1.45 |

The comparison illustrates that the solar cell fabricated in accordance with the invention in Example II has increased in efficiency over the solar cell fabricated by prior art methods.

The efficiency of Example A was still not as high as Example I after two additional 16 hour $H_2$ heat treatments. A further 64 hour $H_2$ heat treatment raised the efficiency of Example A to the level of Example I.

EXAMPLE II

An ITO on glass substrate, product of the PPG Co., was frosted on the glass side and cleaned in a Liquinox solution and then with Chromerge, a product of the Greiner Scientific Corp., glass cleaning solution for 30 minutes. The substrate was rinsed in deionized water, dried and plasma cleaned for 20 minutes in an $O_2$ atmosphere. Thereafter, a thin layer of Zn was deposited on the frosted glass in a Denton model 502 vacuum evaporator. Thereafter, the Zn was plasma cleaned in $O_2$ for 20 minutes and a layer of Cu was vacuum evaporated onto the Zn. The substrate was allowed to cool to room temperature and a Zn basket was put in the vacuum evaporator, the vacuum re-applied and a layer of Zn was evaporated onto the Cu. Cooling water circulated through the substrate holder during the evaporation of the Zn. Thereafter, the substrate was placed in a Varian model 3118 vacuum evaporator and a layer about 30 micrometers thick of CdS was vacuum evaporated onto the Zn/Cu/Zn/frosted glass at a temperature of about 260° C. and a vacuum pressure of about $2 \times 10^{-6}$ Torr. The device was placed in an $N_2$ dry box over the weekend and thereafter the cell active area was defined by a pattern formed of thermosetting plastic TPA-85, a product of Amer. Liq. Xtal, cured at about 170° C. in an $N_2/H_2$ atmosphere for about 30 minutes. The device was etched for 20 seconds in 3 molar HCl followed by a rinse in 600 ml of deionized water at 60° C. and a rinse in deionized water at room temperature. The CdS layer was dipped for about 10 seconds in a solution comprising 900 ml deionized water, 1.5 grams NaCl, 27 ml of 0.5 N HCl, and 4.5 grams of purified CuCl. The solution temperature was about 99° C. The $Cu_xS$ layer was about 0.2 to 0.6 micrometers thick. The device was rinsed for about 10 seconds in deionized water adjusted to pH 2 with HCl. Finally, the device was heat treated for 16 hours at 170° C. in a $N_2/H_2$ (9:1) atmosphere. A gold grid contact was vacuum evaporated onto the $Cu_xS$ layer through a mask. The solar cell was measured in a simulator. The efficiency was then converted to an estimated sunlight efficiency by multiplying by the conversion factor of 1.35 determined from simulator-sunlight comparison on similar cells. The results are given in Table 2 below.

COMPARATIVE EXAMPLE B

A solar cell was fabricated in accordance with the procedures outlined in Example II except that the pH 2 rinse was substituted by a 10 second rinse in deionized water. The device properties were measured as in Example II. Table 2 below illustrates a comparison.

TABLE 2

| Examples | $V_{oc}$ | $J_{sc}$ | F.F. | % | S % |
|---|---|---|---|---|---|
| II | 0.4568 | 10.502 | 0.663 | 3.97 | 5.36 |
| B | 0.4464 | 6.309 | 0.613 | 2.16 | 2.92 |

The comparison illustrates that the solar cell fabricated in accordance with the invention in Example II has higher $V_{oc}$, $J_{sc}$, F.F., and efficiency.

After two further heat treatments of 16 hours each in $H_2/N_2$ at 170° C., the properties of both cells increased but Example II was superior. The efficiency of Example II was 4.17 (simulation), and 5.63% converted to sunlight whereas Example B was 2.71% and 3.66%, respectively.

I claim:

1. A method of fabricating a solar cell, comprising:
   (a) fabricating a layer of CdS on a conductive substrate and forming an ohmic contact thereto;
   (b) fabricating a $Cu_xS$ layer on said layer of CdS;
   (c) rinsing the device of the previous steps (a) and (b) in an aqueous acid rinse having a pH less than about pH 3;
   (d) curing the device of step (c) in $H_2$ at an elevated temperature; and
   (e) fabricating an electrical contact to said copper-containing layer.

2. The method according to claim 1, wherein the rinse is from about 10 to 50 seconds.

3. The method according to claim 2 wherein the acid in the aqueous rinse is a reducing acid with respect to $Cu^{++}$ ions.

4. The method according to claim 2, wherein the acid in the aqueous rinse is selected from the group consisting of hydrochloric acid, sulfuric acid, hydrobromic acid, and hydrofloric acid.

5. The method according to claim 3 or 4, wherein the pH is adjusted to less than about pH 2.

6. The solar cell fabricated according to claim 5.

7. In a method of fabricating a $CdS/Cu_xS$ solar cell, the improvement which comprises:
   (a) rinsing the $CdS/Cu_xS$ layers in an aqueous rinse having an acid which is reducing with respect to $Cu^{++}$ ions and a pH of less than about pH 3 prior to forming an electrical contact to the $Cu_xS$ layer.

8. The solar cell fabricated according to claim 7.

* * * * *